United States Patent [19]
Sobhani

[11] Patent Number: 5,731,708
[45] Date of Patent: Mar. 24, 1998

[54] UNPACKAGED SEMICONDUCTOR TESTING USING AN IMPROVED PROBE AND PRECISION X-Y TABLE

[75] Inventor: Mohi Sobhani, Encino, Calif.

[73] Assignee: Hughes Aircraft Company, Los Angeles, Calif.

[21] Appl. No.: 550,693

[22] Filed: Oct. 31, 1995

[51] Int. Cl.$^6$ .................................................. G01R 31/02
[52] U.S. Cl. ........................................... 324/758; 324/754
[58] Field of Search ..................................... 324/758, 750, 324/751, 754, 760, 757

[56] References Cited

U.S. PATENT DOCUMENTS

| | | | |
|---|---|---|---|
| 3,405,361 | 10/1968 | Kattner et al. | 324/754 |
| 3,651,401 | 3/1972 | Cooney | 324/754 |
| 4,065,717 | 12/1977 | Kattner et al. | 324/754 |
| 4,103,232 | 7/1978 | Sugita et al. | 324/754 |
| 4,266,191 | 5/1981 | Spano et al. | 324/758 |
| 4,706,019 | 11/1987 | Richardson | 324/751 |
| 4,820,976 | 4/1989 | Brown | 324/760 |
| 4,904,933 | 2/1990 | Snyder et al. | 324/758 |
| 5,475,316 | 12/1995 | Hurley et al. | 324/750 |

*Primary Examiner*—Ernest F. Karlsen
*Assistant Examiner*—Anh Phung
*Attorney, Agent, or Firm*—M. E. Lachman; M. W. Sales; W. K. Denson-Low

[57] ABSTRACT

A portable integrated circuit die testing system that offers a cost-effective solution for electrically testing bare, unpackaged, integrated circuit chips or die. The system provides for direct electrical interconnection of die of various sizes and thicknesses to an automatic tester without wire bonding or packaging of the semiconductor chip or die. The system includes an X-Y table that is adjustable in horizontal X and Y directions. A contact platform is disposed above the X-Y table that has an opening therein, and is movable in a vertical direction relative to the X-Y table. An adjustment member is coupled to the contact platform for finely adjusting the movement thereof in the vertical direction. A die holder is secured to the X-Y table for holding the die that is to be tested, and in response to movement of the X-Y table. A vacuum connection is provided for drawing a vacuum on the tested die to secure it in the die holder. A probe flexible printed circuit is secured to the contact platform that extends into the opening in the contact platform and includes a plurality of bumps that mate with contact pads on the die. An interface flexible printed circuit is coupled between the probe flexible printed circuit and the automated test equipment. A microscope is used to align the bumps of the printed circuit to the contact pads on the die, which completes an electrical path between the die and the automated test equipment.

8 Claims, 4 Drawing Sheets

UNPACKAGED SEMICONDUCTOR TESTING USING AN IMPROVED PROBE AND PRECISION X-Y TABLE

BACKGROUND OF THE INVENTION

1. Field of the Invention

The present invention generally relates to semiconductor wafer testing, and more particularly, to an integrated circuit die testing system comprising a probe and precision X-Y table for use in testing unpackaged semiconductor die, and the like.

2. Description of Related Art

The value to an integrated circuit manufacturer of knowing that an integrated circuit die is good before it is integrated into a product increases with the cost of rework and repair caused by defective integrated circuits. Thus, the value of a known good die goes up rapidly with the complexity of the integrated circuit. Unfortunately, so does the cost of testing the integrated circuit. Equipment utilizing individually positioned probes provides an acceptable way to test simple integrated circuits. However, labor costs become prohibitive for testing die with more than 10–20 bond pads. Furthermore, each probe may cost on the order of several hundred dollars or more.

Large volume integrated circuit manufacturers often spend hundreds of thousands of dollars for automated test equipment to ensure that only known good die go into their products. Smaller volume, high reliability applications may warrant the use of labor intensive test systems and methods where each die is manually wire-bonded into a test package, then removed and rebonded into the end product.

However, prior to the present invention, there was no middle ground. Manufacturers who could not justify either the capital-intensive or the labor-intensive approaches for selecting known good die were formed to absorb the costs of rework and repair resulting from bad integrated circuit die.

Prior art techniques relating to testing of unpackaged integrated circuit wafers at the assignee of the present invention and other semiconductor manufacturing concerns have typically involved two types of testing apparatus. The first type required construction of a complex probe using a printed wiring board and associated spring-loaded contacts that were designed to contact test points on a specific semiconductor die, or wafer. The second type required packaging and wire bonding the die, testing the die, and then dismantling the wire-bonded die after testing in order to recover good die. Both of these techniques are time consuming and costly, and required a great deal of effort if only low quantities of die were to be made.

In the past it was necessary to purchase an X-Y table from a commercial vendor. However, typically available X-Y tables are very heavy, very expensive and are not tailored to the particular needs relating to testing of unpackaged semiconductor die. Conventionally available X-Y tables operate using a flat gear mechanism that moves the table in the X and Y directions. Conventional X-Y tables are also bulky and expensive.

Therefore, it is an objective of the present invention to provide for a testing system comprising an improved probe and precision X-Y table for use in testing unpackaged semiconductor chips or die, or the like.

SUMMARY OF THE INVENTION

In order to meet the above and other objectives, the present invention is a portable integrated circuit die testing system that offers a cost-effective solution for electrically testing bare, unpackaged, integrated circuit chips or die. The present invention provides for direct electrical interconnection of a chip or die of various sizes and thicknesses to an automatic tester without wire bonding or packaging of the semiconductor chip or die.

The die testing system comprises a base having a vertical shaft disposed adjacent one edge thereof. An X-Y table is disposed on the base and a die holder is disposed thereon that secures a chip that is to be tested and permits movement and alignment of the chip in X and Y directions (horizontally). Three different size die holders (0.25, 0.50, and 0.75 inches square) were constructed for use with the system. A vacuum connection is incorporated in the die holder that is coupled to a vacuum pump for drawing a vacuum on the die holder to secure the chip therein.

A moveable contact platform having a central opening therein is coupled to the vertical shaft and is moveable in a vertical direction along the shaft. Vertical movement and adjustment of the contact platform is provided using a rotatable handle or lever and a micrometer. A probe flexible printed circuit used to provide electrical connection to the chip is secured to the moveable contact platform and is coupled to one or more interface flexible printed circuits that comprise an interface cable between the probe flexible printed circuit and connectors that are coupled to an automatic tester. The probe flexible printed circuit has a first plurality of bump contacts that are positioned in the central opening of the contact platform that are designed to make contact with contact pads on the chip. The probe flexible printed circuit has a second plurality of bump contacts that mate with pluralities of bumps on the interface flexible printed circuits. A microscope is secured to the vertical shaft and is disposed above the contact platform for use in aligning the contact pads on the chip to bump contacts of the probe flexible printed circuit.

The probe flexible printed circuit is designed to make simultaneous contact with hundreds of bond pads at the periphery of the integrated circuit die. The probe flexible printed circuit terminates in a pattern of raised dots or bump contacts that matches the pattern of bond pads on the integrated circuit die that is to be tested. The two patterns are precisely aligned and pressed together to make electrical contact. An initially reduced to practice embodiment of the test system can make contact with up to 500 bond pads on a die and a version that can contact 1,000 or more bond pads is under development.

The X-Y table is a low weight, low cost X-Y table. The X-Y table has a movement mechanism that has been modified and improved compared to a conventional X-Y table and provides for easy movement in the X and Y directions. The X-Y table incorporates ball bushing bearings and precision screws mounted in perpendicular X and Y directions.

The contact platform may be moved vertically (in the Z-direction) by means of the rotatable handle which operates a rack and pinion, for example, and the micrometer that provides for fine vertical adjustment. The contact platform is made in a manner that allows an operator to swing it laterally away from the area above the die holder where the chip is located without disturbing its position in the Z direction.

The present invention has a relatively low cost compared to conventional die testing systems, uses a low weight movement, permits precise movement of the chip in 0.001 inch increments, and may be custom-tailored to any particular die or chip configuration or size. The X-Y table of the present invention is very thin and lightweight. Four functioning breadboard test systems have been built and function in a desired manner.

BRIEF DESCRIPTION OF THE DRAWINGS

The various features and advantages of the present invention may be more readily understood with reference to the

Figure 1:
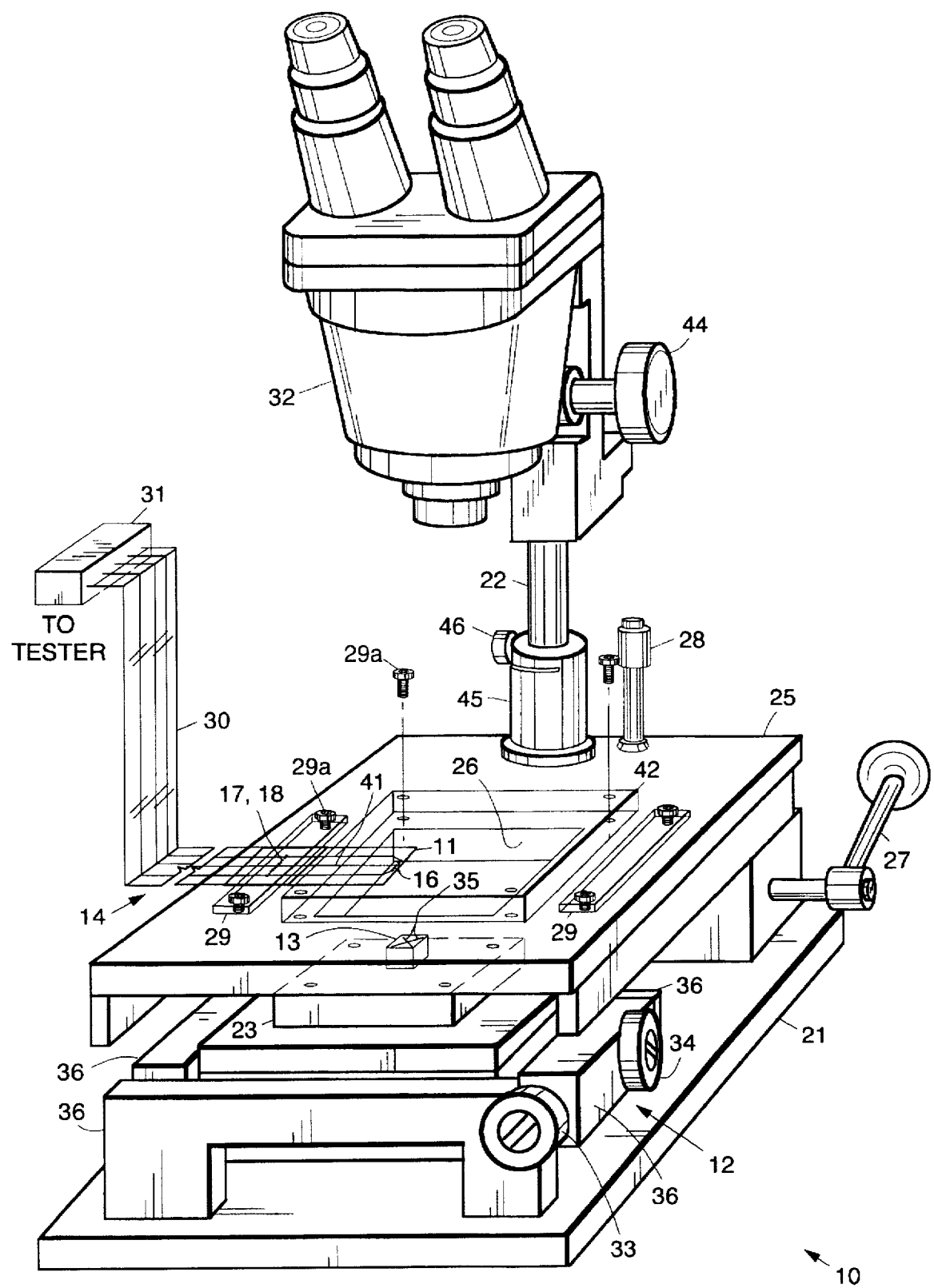
Figure 2:
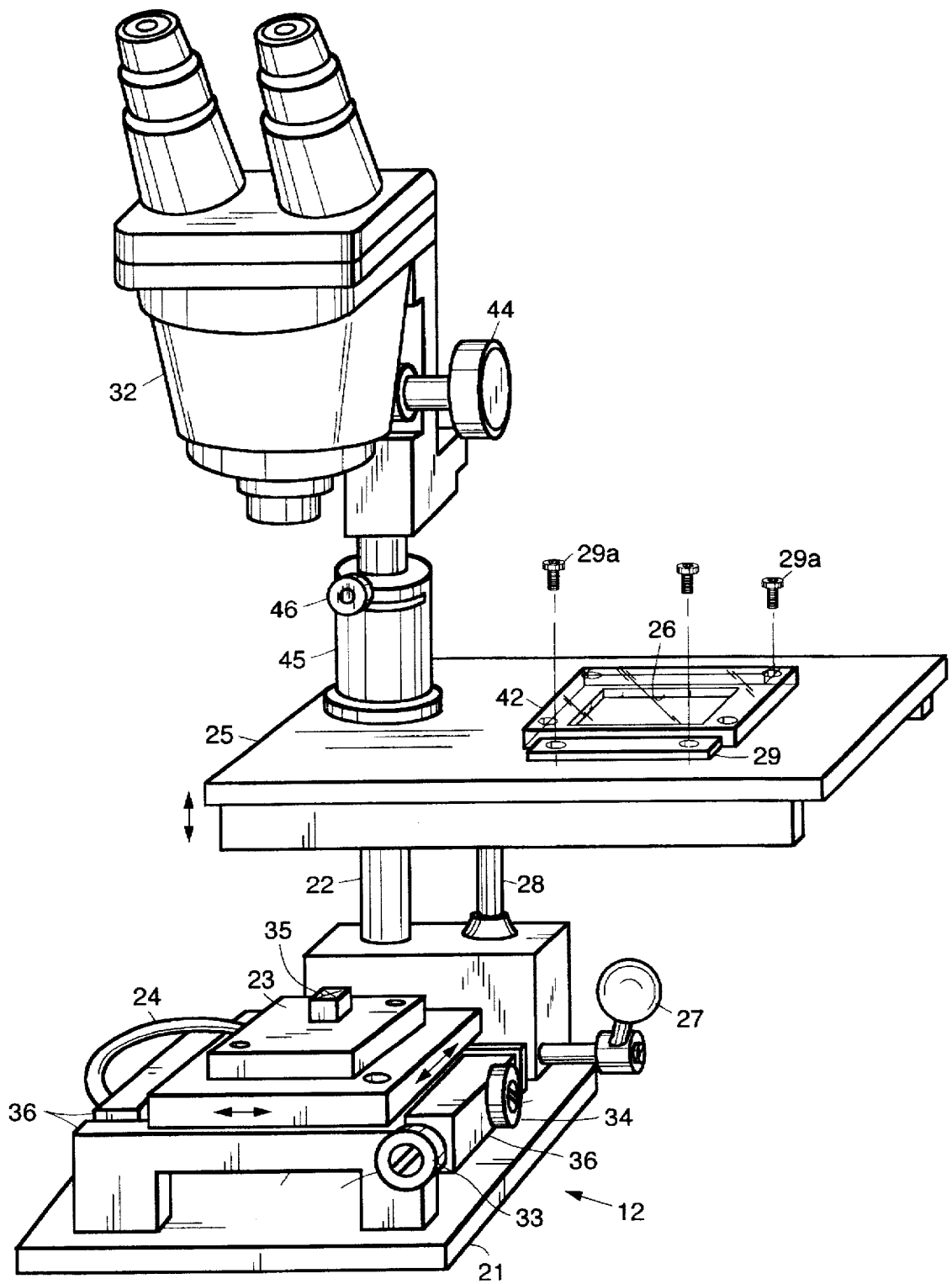
Figure 3:
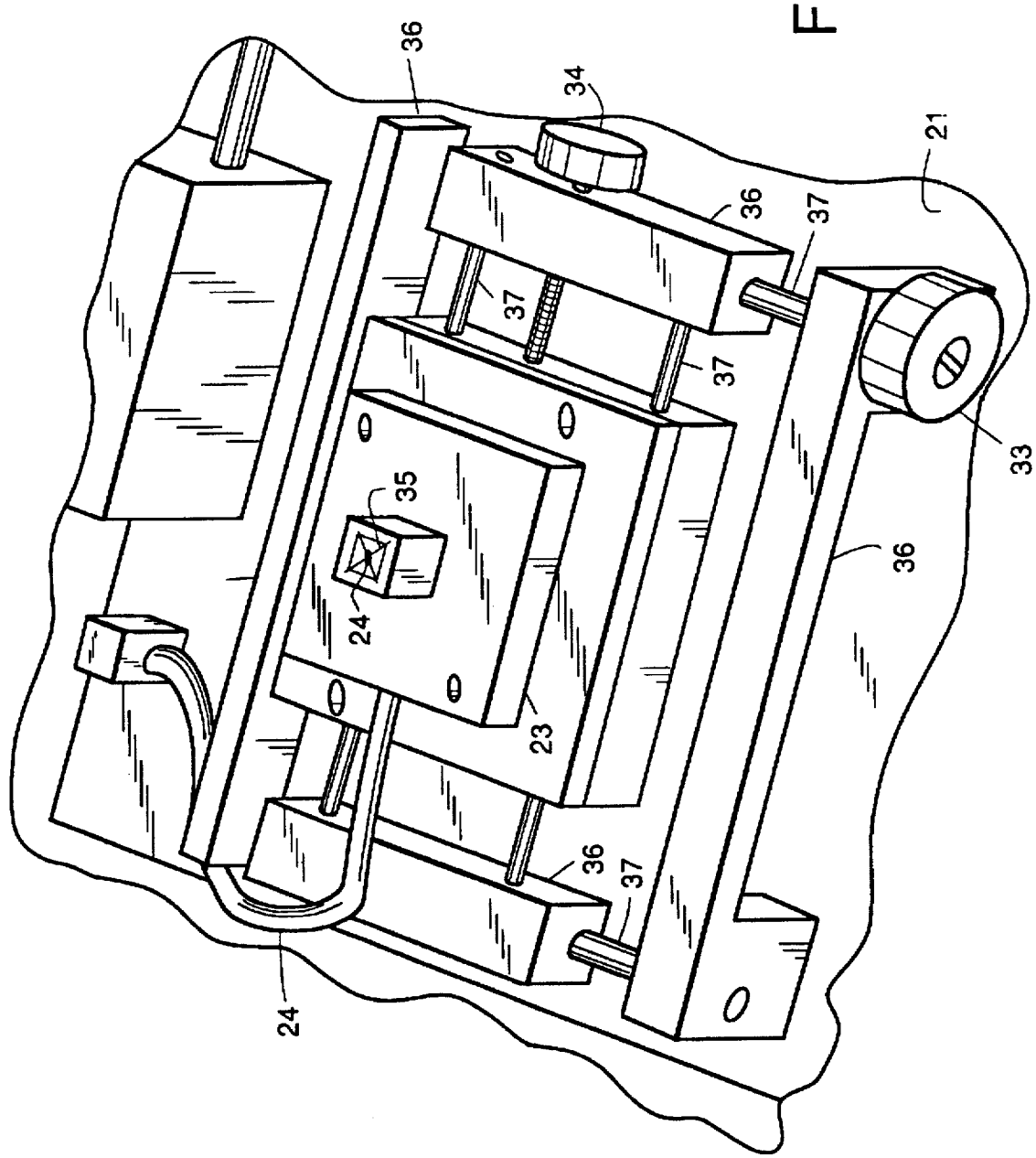
Figure 4:
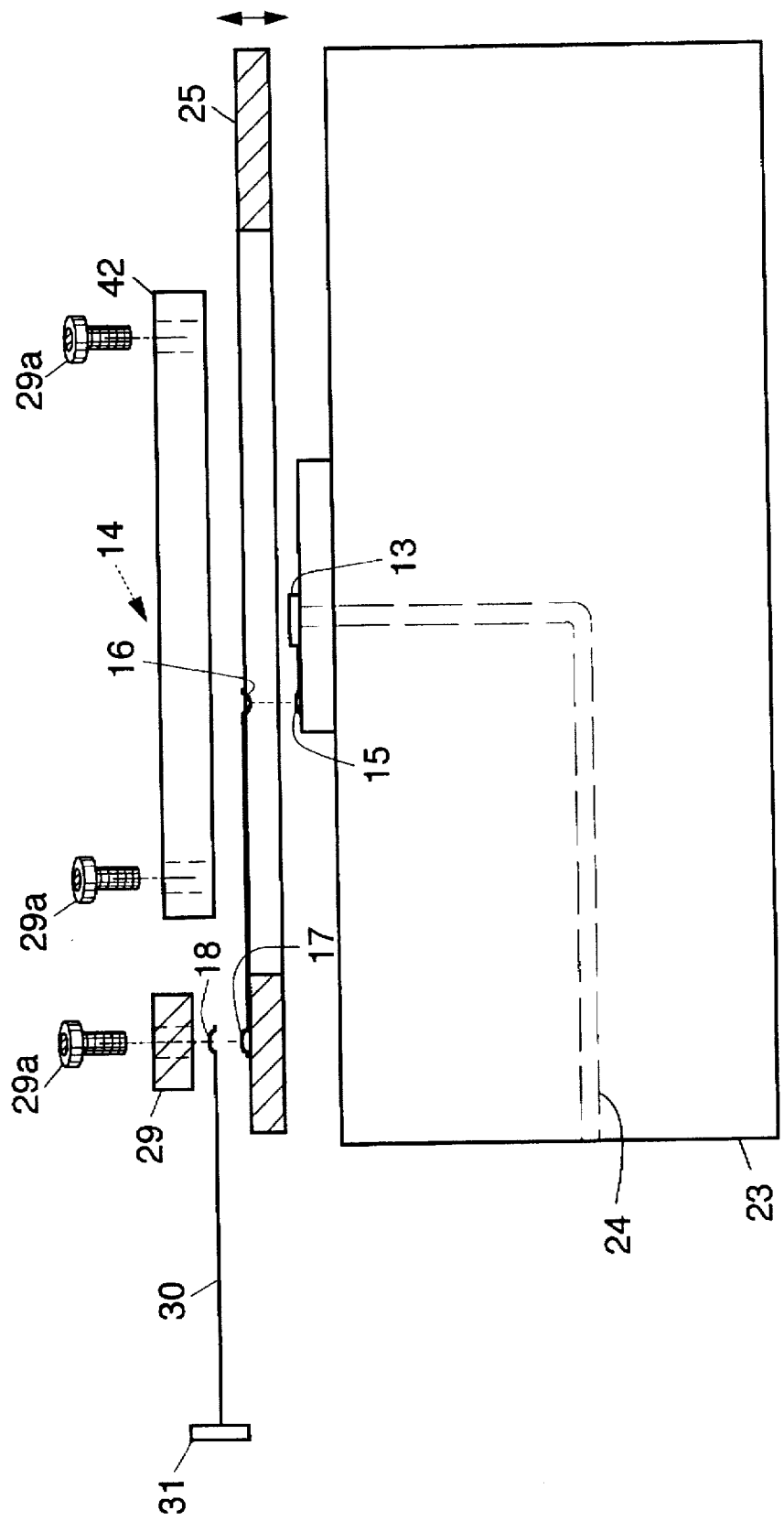

3 following detailed description taken in conjunction with the accompanying drawings, wherein like reference numerals designate like structural elements, and in which:

FIG. 1 illustrates a perspective view of an integrated circuit die testing system having an improved probe and precision X-Y table for use in testing unpackaged semiconductor die, and the like, in accordance with the principles of the present invention;

FIG. 2 illustrates the system of FIG. 1 having its contact platform rotated to permit positioning of a semiconductor die for testing;

FIG. 3 shows a partial view detailing the X-Y table of the system of FIG. 1; and FIG. 4 is a partial cross sectional view of the system of FIG. 1 illustrating electrical connection to the semiconductor die.

DESCRIPTION OF THE PREFERRED EMBODIMENTS

Referring to the drawing figures. FIGS. 1 and 2 illustrate perspective views of an integrated circuit die testing system 10 having an improved electrical probe 11 and precision X-Y table 12 for use in testing unpackaged semiconductor chips 13 or die 13 (shown in FIG. 4). FIG. 3 shows a partial view detailing the X-Y table 12 of the system 10 of FIG. 1, and FIG. 4 is a partial cross sectional view of the system 10 of FIG. 1 illustrating electrical connection to the semiconductor die 13.

The present invention provides a cost-effective solution to the problem of selecting known operational complex integrated circuit die 13. The present invention is a microscope-based testing system 10 that permits rapid connection of complex integrated circuit die 13 to standard commercially-available test equipment. The present system 10 uses a probe flexible printed circuit 14 (that forms the probe 11) in combination with the improved X-Y table 12 to provide an improved portable semiconductor die testing system 10.

The fundamental problem addressed by the present system 10 is how to make simultaneous contact with a pattern comprising hundreds of bond pads 15 (FIG. 4) located at the periphery of a complex integrated circuit die 13. The approach employed in the present invention is to use the probe flexible printed circuit 14 (probe 14) that terminates in a pattern of raised dots 16 or bump contacts 16 that matches the pattern of bond pads 15 on the integrated circuit die 13 that is to be tested. When using the testing system 10, the patterns of raised dots 16 and bond pads 15 are precisely aligned and pressed together to make electrical contact.

Reduced to practice embodiments of the system 10 accommodate integrated circuit die 13 up to 0.75 inches square and makes contact with from 500 to over 1000 bond pads 15 on the die 13. A reduced to practice embodiment of the test system weighs about 15 pounds, and interfaces with any programmed integrated circuit tester, such as a tester manufactured by Century, for example.

The die testing system 10 comprises a base 21 having a vertical shaft 22 disposed adjacent one edge thereof. The X-Y table 12 is disposed on the base 21 and a die holder 23 or removable vacuum chuck 23 is disposed thereon that secures a chip 13 or die 13 that is to be tested and permits movement and alignment of the chip 13 in X and Y directions (horizontally). A vacuum connection 24 is incorporated in the die holder 23 that is coupled to a vacuum pump for drawing a vacuum on the die holder 23 to secure the chip 13 therein.

4

A moveable contact platform 25 having a central opening 26 therein is coupled to the vertical shaft 22 and is moveable in a vertical direction along the shaft 22 (illustrated by means of the vertical double arrow). Vertical movement and adjustment of the contact platform 25 is provided using a rotatable handle 27 or lever 27 and a micrometer 28. The lever 27 is used to coarsely adjust vertical movements. Fine vertical movements are controlled by the micrometer 28.

The probe flexible printed circuit 14 provides electrical connection to the die 13 and is secured to the moveable contact platform 25 and is coupled to one or more interface flexible printed circuits 30 (one is shown) that comprise an interface cable between the probe flexible printed circuit 14 and connectors 31 that are coupled to an automatic tester (not shown). The probe flexible printed circuit 14 has the plurality of raised dots 16 or bump contacts 16 that are positioned in the central opening 26 of the contact platform 25 that are designed to make contact with contact pads 15 on the chip 13. The probe flexible printed circuit 14 has a second plurality of bump contacts 17 that mate with pluralities of bumps 18 on the interface flexible printed circuits 30. A microscope 32 is secured to the vertical shaft 22 and is disposed above the contact platform 25 for use in aligning the contact pads on the die 13 to bump contacts of the probe flexible printed circuit 14. The microscope 32 is positioned in place by means of a collar 45 and locking screw 46. A focus adjustment screw 44 is provided with the microscope 32 for focusing on the die 13.

The probe flexible printed circuit 14 is designed to make simultaneous contact with hundreds of bond pads 15 at the periphery of the integrated circuit die 13. The probe flexible printed circuit 14 terminates in a pattern of raised dots 16 that matches the pattern of bond pads 15 on the integrated circuit die 13 that is to be tested. The patterns of raised dots 16 and bond pads 15 are precisely aligned and pressed together to make electrical contact.

The test system 10 in essence comprises two adjustable stages including a lower stage 12 (the X-Y table 12) used for X- and Y-direction movement and an upper stage 25 (the contact platform 25) used for vertical or Z-direction movement. The probe flexible printed circuit 14 is clamped onto the moveable contact platform 25 by means of one or more terminal blocks 29, for example, secured by means of screws 29a, for example to the contact platform 25. The moveable contact platform 25 may be swung completely aside to facilitate setup operations as is shown FIG. 2.

FIG. 3 shows a close-up view of the lower stage 12 or X-Y table 12. X and Y movements of the lower stage 12 are precisely controlled by two orthogonal thumbwheel screws 33, 34. The integrated circuit die 13 is mounted on the X-Y table 12 by means of the removable vacuum chuck 23. Both metal and insulating chucks 23 are provided for each of three die sizes (0.25, 0.50 and 0.75 inches square). Grooves 35 are precisely machined in the base of each chuck 23, and distribute hold-down pressure evenly over the surface of the die 13 to minimize any chance of mechanical damage during testing. As a further precaution, the dial micrometer 28 is mounted under the stage and is used to monitor contact pressure between the die 13 and the probe flexible printed circuit 14 as the contact platform 25 is lowered. This feature is of particular value with ultra-thin die 13 that may be damaged by excessive contact pressure.

A central plate of the X-Y table 12 on which the vacuum chuck 23 is disposed may be moved in both X and Y directions (illustrated by means of the horizontal double arrow) with the aid of the thumbwheel screws 33, 34. Inside the center plate and also inside lateral bearing rails 36, several small ball bearing bushings (not shown) ride on four shafts 37 as shown in FIG. 3. Several wave washers and tapped screws (not shown) are used to assemble the lower stage 12.

Damage from electrostatic discharge may be avoided by grounding the testing system 10 to a workbench, for example. Provisions (not shown) are also made for plugging an operator's wrist strap into the base of the testing system 10.

The probe flexible printed circuit 14 used to test an integrated circuit die 13 is formed as follows. Starting with a dimensionally accurate image of the pad layout of the integrated circuit die 13, photolithographic methods are used to fabricate the probe flexible printed circuit 14, terminating in a pattern of raised dots 15 or bumps 15, such as gold dots, for example, that is congruent with the integrated circuit pad layout. Conductors 41 on the probe flexible circuit 14 are laid out on the contact platform 25 in strips, radiating perpendicularly from one or more sides of the integrated circuit die 13. The strips are each clamped to dimpled terminal blocks 29 mounted on the contact platform 25, where they are mated with corresponding interface flexible circuits 30. The interface flexible circuits 27 are connected to terminals of the integrated circuit tester by means of the connectors 31.

In operation, the coarse-adjustment lever 17 is used to raise the contact platform 25 by approximately 1 inch so that the probe flexible printed circuit 14 may be installed. The contact platform 25 is then lowered to a level just above its final position. The die holder 23 or removable vacuum chuck 23 bearing the integrated circuit die 13 is moved into place beneath the contact platform 25. The orthogonal thumbwheel screws 33, 34 provide X and Y adjustments that are used to align the bond pads 15 of the integrated circuit die 13 with the contacts 16 of the probe flexible printed circuit 14 and the micrometer 28 is used to lower the contact platform 25 into its final position. Small irregularities in the surfaces of either the probe flexible printed circuit 14 or the integrated circuit die 13 are accommodated through the use of a clear robber member 42 that presses down on the probe flexible printed circuit 14. The procedure requires only minutes to complete. Testing of the integrated circuit die is then carried out in a conventional manner using the conventional integrated circuit test equipment.

Thus there has been described a new and improved testing system having an improved probe and precision X-Y table for use in testing unpackaged semiconductor die, and the like. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A testing system for connecting an integrated circuit die having a plurality of contact pads to automated test equipment, said testing system comprising:

a base plate;

an X-Y table secured directly to the base plate that is adjustable in horizontal X and Y directions relative to the base plate;

a die holder secured to the X-Y table for securing the die that is to be tested to the X-Y table, which die holder is movable in response to movement of the X-Y table;

vacuum means connected to the die holder for drawing a vacuum on the tested die to secure the die to the die holder;

a contact platform disposed above the X-Y table that has an opening therein, and wherein the contact platform is movable in a vertical direction relative to the X-Y table;

adjustment means coupled to the contact platform for finely adjusting the movement of the contact platform in the vertical direction;

a probe flexible printed circuit secured to the contact platform that extends into the opening in the contact platform and that includes a plurality of bumps that are designed to mate with contact pads on the die;

an interface flexible printed circuit coupled at a first end by means of a plurality of bumps to the probe flexible printed circuit and at a second end to the automated test equipment; and a microscope disposed above the contact platform for aligning the bumps of the printed circuit to the contact pads on the die.

2. The system of claim 1 wherein the adjustment means comprises a micrometer.

3. The system of claim 1 wherein the microscope comprises a vertically adjustable microscope coupled to the base plate.

4. The system of claim 1 wherein the interface flexible printed circuit further comprises a connector that mates with a corresponding connector on the automated test equipment.

5. The system of claim 1 further comprising a clear robber member that presses on the probe flexible printed circuit to insure contact between the bumps of the probe flexible printed circuit and the contact pads on the die.

6. The system of claim 1 wherein the die holder comprises a removable vacuum chuck.

7. The system of claim 1 wherein X and Y movements of the X-Y table are precisely controlled by two orthogonal thumbwheel screws.

8. The system of claim 1 wherein the die holder comprises grooves machined therein to distribute hold-down pressure evenly over the surface of the die.

* * * * *